(12) United States Patent
Irvine et al.

(10) Patent No.: US 7,057,457 B2
(45) Date of Patent: Jun. 6, 2006

(54) LOW-NOISE AMPLIFYING CIRCUIT

(75) Inventors: Robert-Grant Irvine, Greensboro, NC (US); Harald Pretl, Schwertberg (AT); Claus Stoeger, Linz (AT); Wolfgang Thomann, Linz (AT)

(73) Assignee: Infineon Technologies AG, Munich (DE)

( * ) Notice: Subject to any disclaimer, the term of this patent is extended or adjusted under 35 U.S.C. 154(b) by 27 days.

(21) Appl. No.: 10/482,651

(22) PCT Filed: Jun. 19, 2002

(86) PCT No.: PCT/DE02/02233

§ 371 (c)(1),
(2), (4) Date: Mar. 19, 2004

(87) PCT Pub. No.: WO03/005566

PCT Pub. Date: Jan. 16, 2003

(65) Prior Publication Data

US 2005/0068106 A1    Mar. 31, 2005

(30) Foreign Application Priority Data

Jul. 6, 2001    (DE) ................ 101 32 800

(51) Int. Cl.
*H03F 3/45* (2006.01)
(52) U.S. Cl. .............. 330/252; 330/254; 330/260; 330/282; 330/283; 330/285; 330/311
(58) Field of Classification Search .............. None
See application file for complete search history.

(56) References Cited

U.S. PATENT DOCUMENTS

| | | | |
|---|---|---|---|
| 4,940,949 A * | 7/1990 | Landi | 330/311 |
| 5,530,404 A | 6/1996 | Debroux | 330/228 |
| 5,977,828 A | 11/1999 | Hu et al. | 330/254 |
| 6,023,192 A | 2/2000 | Didier | 330/254 |
| 6,127,886 A | 10/2000 | Khabbaz et al. | 330/51 |
| 6,147,559 A * | 11/2000 | Fong | 330/311 |
| 6,211,737 B1 | 4/2001 | Fong | 330/282 |
| 6,396,347 B1 * | 5/2002 | Lie et al. | 330/285 |

FOREIGN PATENT DOCUMENTS

EP    0 833 442 A1    4/1998

(Continued)

OTHER PUBLICATIONS

English language abstract of European Patent Application EP 0 899 869 A1.

(Continued)

*Primary Examiner*—Khanh V. Nguyen
(74) *Attorney, Agent, or Firm*—Eschweiler & Associates, LLC

(57) ABSTRACT

A low-noise amplifier circuit is specified which has a switchable gain ratio. For this purpose, a parallel circuit comprising a first and a second current path (3, 4) is provided between a radio-frequency signal input and output (1, 2), with the first current path (3) having a transistor which is connected in a common-base circuit for signal amplification, and the second current path (4) having a transistor which is connected in a common-emitter circuit (7) for signal amplification, and has input impedance matching (25, 27). Owing to the good noise characteristics and the good linearity characteristics, the described low-noise amplifier circuit is suitable for use in radio-frequency receivers in which adaptive pre-amplification is required even before a frequency converter, that is to say at the radio-frequency level, because the input signal has a wide dynamic range, such as that in the case of UMTS.

25 Claims, 2 Drawing Sheets

FOREIGN PATENT DOCUMENTS

| | | |
|---|---|---|
| EP | 0 847 135 A2 | 6/1998 |
| EP | 0 899 869 A1 | 3/1999 |
| EP | 0 920 122 A2 | 6/1999 |

OTHER PUBLICATIONS

Hull, C.D., et al.: "A Direct-Conversion Receiver for 900 MHz (ISM Band) Spread-Spectrum Digital Cordless Telephone", IEEE Journal of Solid-State Circuits, vol. 31, No. 12, Dec. 1996, pp. 1955-1963.

Pennisi, S., et al.: "A New Design Approach for Variable-Gain Low Noise Amplifiers", 2000 IEEE (4 pages).

Voinigescu, S.P., et al.: "A Scalable High-Frequency Noise Model for Bipolar Transistors with Application to Optimal Transistor Sizing for Low-Noise Amplifiers Design", IEEE Journal of Solid-State Circuits, vol. 32, No. 9, Sep. 1997, pp. 1430-1439.

Fong, et al.: "Dual-Band High-Linearity Variable-Gain Low-Noise Amplifiers for Wireless Applications", 1999 IEEE International Solid-State Circuits Conference, Philips Semiconductors, Sunnyvale, California (11 pages).

Long, J.R.: "A Low-Voltage 5.1-5.8-Ghz Image-Reject Downconverter RF IC", IEEE Journal of Solid-State Circuits, vol. 35, No. 9, Sep. 2000, pp. 1320-1328.

* cited by examiner

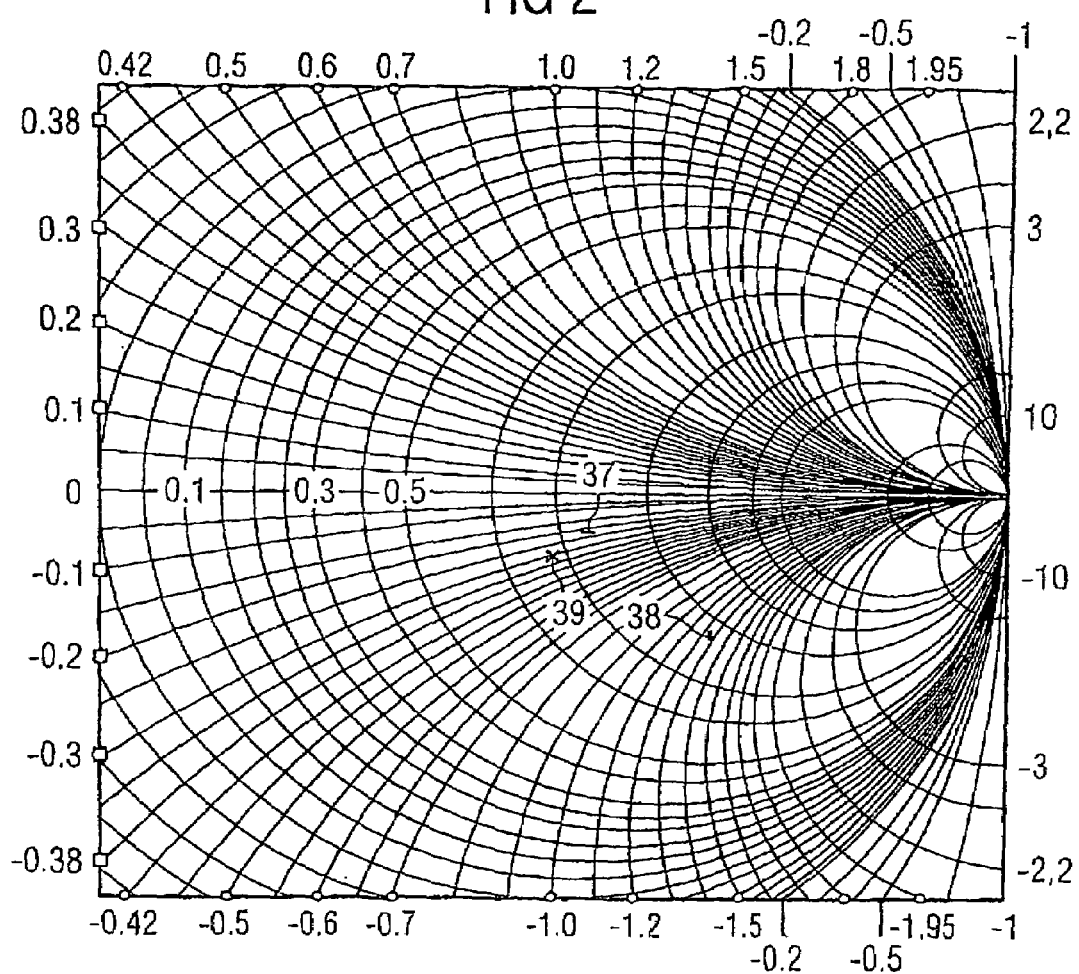

LOW-NOISE AMPLIFYING CIRCUIT

The present invention relates to a low-noise amplifier circuit.

Low-noise amplifiers LNA are normal signal processing blocks for radio-frequency reception.

Mobile radio standards which operate using code-division multiple access methods, such as W-CDMA, Wideband Code Division Multiple Access, use radio-frequency signals with a wide dynamic range of, for example, 80 dB. In mobile radio receivers such as these, signals with low input levels must be amplified using low-noise amplifiers even before frequency conversion.

For high reception levels, excessive gain would lead to overdriving of the subsequent stages in the signal processing chain of the receiver and to contravention of the linearity requirement in the respective mobile radio standard. It is therefore desirable to design low-noise amplifiers which have a variable gain factor.

Further requirements which are applicable to an amplifier that is suitable for the methods which have been mentioned are a high adjustable gain in order to obtain good noise characteristics overall, as well as compliance with the strict linearity requirements, which are not consistent with high gain. Furthermore, good input-side matching must be provided in terms of both the power and the noise in order to achieve good matching to the output impedance of an upstream filter when the levels to be expected are low. If a mixer that is connected downstream from the LNA is not in the form of a mixer which suppresses mirror frequencies, then the LNA must have good backward isolation, in order to suppress leakage frequencies from the local oscillator signal which can be supplied to the mixer. Since mobile radio receivers in the described category are normally used not only in fixed stations, but also in mobile stations, attention should also be paid to low power consumption.

In the case of UMTS (Universal Mobile Telecommunications Standard) appliances, in which the noise factor over the entire receiver chain must not exceed 8 dB, from which the expected insertion loss of a filter of 3 dB and the downstream stages, likewise of 3 dB, must be subtracted, this means that the desired low-noise amplifier should guarantee a noise factor of <2 dB with a high gain of >15 dB.

Section B.) of the document J. R. Long "A Low-Voltage 5.1–5.8-GHz Image-Reject Downconverter RF IC", Journal of Solid-State Circuits, Vol. 35, No. 9, September 2000, pp. 1320–1328 describes how good noise matching and power matching can be achieved at the same time for an amplifier in which a transistor is operated in a common-emitter circuit. Even if the amplifier is operated with inductive degeneration, that is to say the emitter inductance with respect to the reference-ground potential, with a collector load in the form of a resonant circuit as well as a cascode circuit, a particularly high current density is required in the input transistor in order to achieve adequate linearity. In UMTS receivers, LNAs are operated with low gain for 80% of the time, so that the problem of power wastage is further exacerbated.

In addition, a circuit implementation which is feasible in this case in order to achieve a switchable gain by derivation of a part of the output current with respect to the supply voltage leads only to an insignificant improvement in the linearity while, in contrast, the noise in the amplifier increases severely.

The described problems could be overcome by using a circuit with a transistor which is connected in a common-emitter circuit when the desired LNA gain is high, and by using a low LNA gain, with a separate amplifier stage with a transistor which is connected in a common-base circuit.

Interconnection such as this results, however, in the problem that the two amplifiers in the common-base and common-emitter circuits have a different input impedance, which prevents noise and power matching by means of a common matching network.

The object of the present invention is to specify a low-noise amplifier whose capability to adjust the gain means that it is suitable for code-division multiple access methods and which offers good noise and power matching capability.

According to the invention, the object is achieved by a low-noise amplifier circuit, having a signal input for supplying a radio-frequency signal, a signal output for producing an amplified signal which is derived from the radio-frequency signal, a first current path, which couples the signal input to the signal output and has a transistor connected in a common-base circuit, a second current path, which couples the signal input to the signal output and has a transistor connected in a common-emitter circuit, with the transistor which is connected in a common-emitter circuit being followed by a further transistor connected in a common-base circuit in order to form a cascode circuit, and with the transistor which is connected in a common-emitter circuit having a feedback path between its collector and base connections, as well as a resistor which couples the collector connection of the transistor which is connected in a common-emitter circuit to the emitter connection of the further transistor which is connected in a common-base circuit, and a switching device for activation of the first or second signal path as a function of the desired gain.

The described LNA (Low Noise Amplifier) structure offers the capability to switch between two fixed gain ratios and is thus in principle suitable for amplification of W-CDMA signals with a wide dynamic range. The LNA can therefore be used in receivers for the UMTS mobile radio standard.

The signal path with the transistor which is connected in a common-emitter circuit operates with high gain and with very good efficiency, and thus complies with the linearity, gain and noise requirements that are applicable in this amplification range. The current path with the transistor which is connected in a common-base circuit is provided for low gain levels, allowing high linearity to be achieved with low gain and with a low power consumption. The input impedance is in this case virtually real and corresponds to the reciprocal of the gradient and, furthermore, the backward isolation is very good. The effects of the relatively poor noise characteristics of the common-base circuit are minor since the common-base circuit is used for low gain so that high input levels are therefore in any case present at the signal input. The signal-to-noise ratio, SNR, is therefore reduced only slightly.

The feedback between the collector and base connection of the transistor which is connected in a common-emitter circuit in the second current path results in transconductance, that is to say compensation for the input impedance of the emitter circuit, which is otherwise highly capacitive. The series resistance which is also provided for coupling the cascode transistor to the transistor which is connected in a common-emitter circuit also provides voltage amplification, which further improves the linearity, noise and efficiency of the circuit.

Since the common-emitter circuit has an inverting behavior, the feedback between the collector and the base of the transistor may be in the form of capacitive feedback, which acts like an inductance and thus compensates for the actually capacitive input impedance to form a virtually real input impedance.

In consequence, both the first and the second current path with the transistor which is connected in a common-base circuit and the transistor which is connected in a common-emitter circuit each have a virtually real input impedance, which provides simple noise and power matching to an upstream stage.

Since this therefore avoids the use of an additional on-chip inductance, which would consume a relatively large amount of chip area, this on the one hand makes it possible to provide a circuit with a small chip area while, on the other hand, this avoids interference coupling resulting from the large chip area of an additional inductance.

In one preferred embodiment of the present invention, the feedback path of the transistor which is connected in a common-emitter circuit has a resistor and capacitance connected in series.

In principle, any desired combination of resistances, capacitances and inductances may be used in the capacitive feedback path, but a series circuit comprising resistance and capacitance leads to particularly good results with regard to noise characteristics and gain.

In a further preferred embodiment of the present invention, the first and the second current path, as well as the signal input and the signal output of the LNA, are based on symmetrical circuitry.

The symmetrical circuitry for carrying differential signals offers a high degree of insensitivity to interference in the amplifier arrangement and, furthermore, allows simple connection to a downstream frequency mixer without any additional circuitry measures. Furthermore, symmetrical circuitry means that there are no sudden phase changes when switching the gain, as would otherwise occur as a result of the inverting behavior of the common-emitter circuit and the non-inverting behavior of the common-base circuit. The transistors which are described in the first and second current paths each have to be provided in a duplicated form, corresponding to the symmetrical circuitry. The two transistors which are connected in a common-emitter circuit in the second current path in this case form a differential amplifier, with the emitter connections being coupled.

In a further preferred embodiment of the present invention, the first current path has a cascode stage which is connected downstream from the transistor which is connected in a common-base circuit. This makes it possible to increase the backward isolation.

In a further preferred embodiment of the present invention, the switching device has a first switch, which is connected to a control input of the transistor which is connected in a common-base circuit, for connection/disconnection of a first bias voltage, and has a second switch, which is connected to a control input of the further transistor which is connected in a common-base circuit in the second current path, for connection/disconnection of a second bias voltage.

In addition to the described switching between high and low gain in the LNA, the current sources which supply the current paths can preferably be connected and disconnected. In addition to better noise characteristics, this also makes it possible to reduce the power requirement.

In a further preferred embodiment of the present invention, a resonant circuit is provided which couples the two current paths on the signal output side to a supply potential connection and may be designed to have a narrow bandwidth. The tunable coupling via a system which can oscillate, that is to say a tank, leads on the one hand to the avoidance of a DC voltage drop from the supply voltage and thus to better utilization of the voltage in the amplifiers while, on the other hand, the resonant circuit allows matching to normally capacitive loads without any additional complexity. The narrowband resonant circuit may be formed, for example, with a coil with a center tap for connection to the supply voltage and capacitances. Furthermore, the narrowband resonant circuit results in a slight improvement in selectivity in the amplifier.

In a further preferred embodiment of the present invention, the transistor which is connected in a common-emitter circuit in the second current path is provided with an inductance which couples the emitter connection of the transistor to a reference-ground potential connection.

This so-called inductive degeneration leads to better linearity characteristics and to a better matching capability for the input impedance with regard to power and noise.

In a further preferred embodiment of the present invention, a series capacitance is provided for coupling the signal input and the first current path. Instead of the series capacitance, other components with a high-pass filter characteristic may also be provided.

In a further preferred embodiment of the present invention, a first current source is provided for supplying the first current path and is coupled, such that it can be connected/disconnected, to the transistor which is connected in a common-base circuit.

In a further preferred embodiment of the present invention, a second current source is provided for supplying the second current path and is coupled, such that it can be connected/disconnected and via a current mirror transistor, to the second current path.

The current mirror transistor may in this case preferably be connected via resistors to the base connections of the transistors which are connected in a common-emitter circuit.

Further details and embodiments of the invention are the subject matter of the dependent claims.

The invention will be explained in more detail in the following text using an exemplary embodiment and with reference to the drawings, in which:

FIG. 2 shows an S-parameter diagram in order to illustrate the input impedance matching according to the invention.

FIG. 1 shows a low-noise amplifier designed using analog, bipolar circuitry and with signals being carried symmetrically. The low-noise amplifier LNA has a symmetrical signal input 1 and a symmetrical signal output 2, at which an amplified signal can be tapped off.

Figure 1:
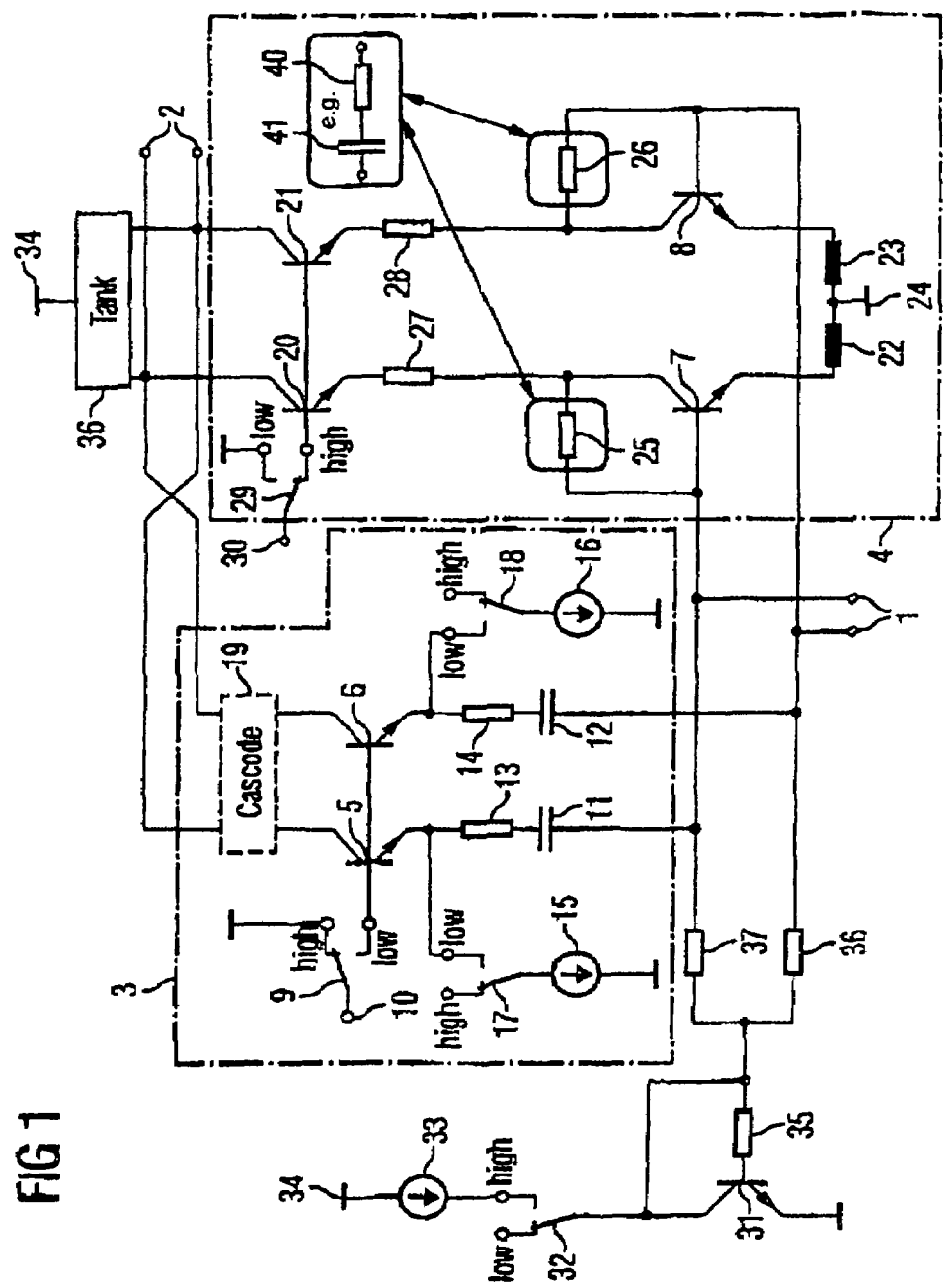
FIG. 1 shows a first exemplary embodiment of a low-noise amplifier according to the invention, designed using symmetrical circuitry.

Two parallel current paths 3, 4 are provided between the signal input 1 and the signal output 2, with a switching capability being provided between the current paths 3, 4 in order to achieve a switchable-gain LNA.

The first current path 3 has two transistors 5, 6 which are connected in a common-base circuit, while the second current path 4 has two bipolar transistors 7, 8, which are operated in a common-emitter circuit and form a differential amplifier stage. The second current path 4 is activated in order to achieve high gain, while low gain levels, that is to say when high signal levels are present at the input 1, are produced by the first current path 3.

In detail, the first current path 3 has the two bipolar transistors 5, 6, whose base connections are connected to one another and can be connected via a switch 9, such that they can be connected to a fixed bias voltage source. The connection for supplying the bias voltage is annotated 10. The emitter connections of the transistors 5, 6 are coupled via a respective series circuit comprising a capacitance 11, 12 and a resistor 13, 14 to the symmetrical signal input 1, with the capacitances 11, 12 being connected upstream of the resistors 13, 14 in the signal transmission direction. A respective current source 15, 16, which is connected to a reference-ground potential, is also in each case connected via a respective further switch 17, 18 to the emitter connections of the transistors 5, 6. The collector connections of the transistors 5, 6 are coupled to the signal output 2, with the signal lines for carrying the differential signal in the second current path being routed such that they are crossed over in order to prevent a sudden phase change when switching between the first and the second current path. A cascode stage 19 is optionally provided between the collector connections of the transistors 5, 6 and the signal output 2. The switches 9, 17, 18 must be closed in order to activate the first current path, in order on the one hand to supply a constant bias voltage to the base connection of the transistors 5, 6 and, on the other hand, supply the current, which must be provided for the current gain, on the emitter side. When the first current path 3 is not activated, that is to say when the higher gain is selected, the switches 9, 17, 18 are opened. In the last-mentioned state, the output side of the switch 9 is connected to a reference-ground potential connection.

The second current path 4 has a differential amplifier with a cascode circuit and includes the two transistors 7, 8, which are operated in a common-emitter circuit, as well as two further transistors 20, 21, which are operated in a common-base circuit. In order to form the differential amplifier circuit with a cascode stage, the emitter connections of the transistors 20, 21 are coupled to a respective collector connection of the transistors 7, 8. The base connections of the transistors 7, 8, which are operated in a common-emitter circuit, are connected to the symmetrical signal input 1.

The emitter connections of the transistors 7, 8 are connected to a reference-ground potential connection 24 via a respective inductance 22, 23. Feedback impedances 25, 26 are provided for matching the capacitive input impedance of the second current path 4 with the differential amplifier which is connected in a common-emitter circuit, and respectively connect the base connection and collector connection of the transistors 7, 8 to one another. In order to provide additional voltage gain, respective resistors 27, 28 are provided between the emitter connections of the transistors 20, 21 and the collector connections of the transistors 7, 8.

The base connections of the cascode transistors 20, 21 are connected to one another, and are connected via a switch 29 to a connection 30 for supplying a second bias voltage. The switch 29 is closed in order to activate the higher gain, while the switch 29 is opened during activation of the first current path 3, thus connecting the input 30 to the reference-ground potential connection 24. The impedances 25, 26 in the present embodiment are in the form of a series circuit comprising a capacitance 41 with a resistor 40.

In order to supply current to the differential amplifier 7, 8 in the second current path 4, the transistors 7, 8 each form a current mirror with a current mirror transistor 31. The current mirror transistor 31 is connected to the reference-ground potential connection 24 via its emitter connection. A current source 33, which is connected to a supply potential connection 34, is connected via a switch 32 to the collector connection of the current mirror transistor 31. The base connection of the current mirror transistor 31 is connected via a resistor 35 to its collector connection. This collector connection is connected via a respective resistor 36, 37 to a base connection of the respective transistors 7, 8.

The first and second current paths 3, 4 are also connected on the signal output side, that is to say at that symmetrical circuit node which connects the two current paths to one another and to the signal output 2, to the supply potential connection 34, via a narrowband resonant circuit 36.

The resistors 27, 28 allow sufficiently high voltage gain in order to achieve input impedance matching by means of the impedances 25, 26 via voltage/current feedback, that is to say shunt—shunt feedback, such that the normally capacitive input impedance of the second current path 4 becomes virtually purely real, and thus corresponds to the input impedance of the transistors which are connected in a common-base circuit in the first current path. This allows the circuit as illustrated in FIG. 1 to be matched in a simple manner in terms of power and noise to an upstream stage, for example a filter. On the output side, a downward mixer in a mobile radio receiver may be connected, for example, to the circuit shown in FIG. 1.

The switching between high and low gain allows narrowband radio-frequency signals, which are coded using a code-division multiple access method and have a wide dynamic range, to be pre-amplified before downward mixing, with little noise, a high gain, with a low signal level, and with good linearity characteristics overall. Furthermore, the described LNA has good backward isolation and is thus suitable for suppression of local oscillator leakage frequencies even in homodyne receivers which do not have mirror-frequency suppressing filters. The symmetrical design of the described LNA offers a high degree of insensitivity to interference. Overall, the circuit as shown in FIG. 1 can be operated with a low power requirement. This allows it to be used in mobile appliances, for example mobile stations, which operate in accordance with the UMTS Standard. The use of the inverting characteristics means that there is no need for any inductances to form the impedances 25, 26 in the second current path 4 in the feedback path for input impedance matching, so that the circuit can be formed with a small area and with low sensitivity to interference.

The circuit shown in FIG. 1 with a first and a second current path can be matched by means of just one matching network to an upstream stage, for example a filter.

FIG. 2 uses a diagram based on an S parameter representation to show how the circuit illustrated in FIG. 1 operates. The point that is provided with the reference symbol 37 denotes the input impedance of the common-base circuit in the first current path 3. The reference symbol 38 denotes the input impedance of the differential amplifier 7, 8 without any feedback with the elements 25 to 28, while the reference symbol 39 denotes the matched input impedance, as illustrated in FIG. 1. As can be seen, the input impedances 37, 39 are sufficiently close to one another that the two amplifier stages can now be matched using the same matching network. FIG. 2 also shows that matching to a previous stage would be possible even without any additional elements. However, an external network simplifies the matching between the noise behavior, the linearity and the gain.

LIST OF REFERENCE SYMBOLS

1 Signal input
2 Signal output
3 First current path

4 Second current path
5 Transistor
6 Transistor
7 Transistor
8 Transistor
9 Switch
10 Supply voltage supply connection
11 Capacitor
12 Capacitor
13 Resistor
14 Resistor
15 Current source
16 Current source
17 Switch
18 Switch
19 Cascode stage
20 Transistor
21 Transistor
22 Inductance
23 Inductance
24 Reference-ground potential connection
25 Impedance
26 Impedance
27 Resistor
28 Resistor
29 Switch
30 Supply voltage supply connection
31 Current mirror transistor
32 Switch
33 Current source
34 Supply potential connection
35 Resistor
36 Resonant circuit
37 Input impedance
38 Input impedance
39 Input impedance
40 Resistor
41 Capacitor

The invention claimed is:

1. A low-noise amplifier circuit, comprising:
a signal input for receiving a radio-frequency signal;
a signal output for providing an amplified signal which is derived from the radio-frequency signal;
a first current path coupled between the signal input and the signal output, said first current path including a first transistor connected in a common-base circuit;
a second current path coupled between the signal input and the signal output, said second current path including a second transistor connected in a common-emitter circuit, the second transistor having a collector and a base, and including a feedback path coupled between the collector and the base of the second transistor;
a third transistor connected in a common-base circuit;
a resistor coupled between the collector of the second transistor and an emitter of the third transistor; and
a switching device comprises a plurality of switches for selectively activating one of the first and second current paths as a function of a desired gain.

2. The amplifier circuit of claim 1, wherein the feedback path includes a resistor and a capacitance connected in series.

3. The amplifier circuit of claim 2, including a resonant circuit coupled to the signal output and the first and second current paths, the resonant circuit adapted for connection to a supply potential.

4. The amplifier circuit of claim 3, including an inductance for coupling the emitter of the second transistor to a reference potential.

5. The amplifier circuit of claim 2, including an inductance for coupling the emitter of the second transistor to a reference potential.

6. The amplifier circuit of claim 1, wherein the signal input, the signal output and the first and second current paths are for carrying differential signals.

7. The amplifier circuit of claim 6, including a resonant circuit coupled to the signal output and the first and second current paths, the resonant circuit adapted for connection to a supply potential.

8. The amplifier circuit of claim 7, including an inductance for coupling the emitter of the second transistor to a reference potential.

9. The amplifier circuit of claim 6, including an inductance for coupling the emitter of the second transistor to a reference potential.

10. The amplifier circuit of claim 1, wherein the first current path includes a cascode stage connected between the first transistor and the signal output.

11. The amplifier circuit of claim 10, including a resonant circuit coupled to the signal output and the first and second current paths, the resonant circuit adapted for connection to a supply potential.

12. The amplifier circuit of claim 11, including an inductance for coupling the emitter of the second transistor to a reference potential.

13. The amplifier circuit of claim 10, including an inductance for coupling the emitter of the second transistor to a reference potential.

14. The amplifier circuit of claim 10, wherein the switching device includes a first switch connected to the first transistor for selectively connecting a first bias voltage to the first transistor, and a second switch connected to the third transistor for selectively connecting a second bias voltage to the third transistor.

15. The amplifier circuit of claim 14, including a resonant circuit coupled to the signal output and the first and second current paths, the resonant circuit adapted for connection to a supply potential.

16. The amplifier circuit of claim 15, including an inductance for coupling the emitter of the second transistor to a reference potential.

17. The amplifier circuit of claim 14, including an inductance for coupling the emitter of the second transistor to a reference potential.

18. The amplifier circuit of claim 1, including a resonant circuit coupled to the signal output and the first and second current paths, the resonant circuit adapted for connection to a supply potential.

19. The amplifier circuit of claim 18, including an inductance for coupling the emitter of the second transistor to a reference potential.

20. The amplifier circuit of claim 1, including an inductance for coupling the emitter of the second transistor to a reference potential.

21. The amplifier circuit of claim 1, including a capacitance coupled in series between the signal input and the first current path.

22. The amplifier circuit of claim 1, including a first current source coupled to the first current path for feeding the first current path, the first current source selectively connectable to the first transistor.

23. The amplifier circuit of claim 22, including a second current source for feeding the second current path, and a current mirror transistor for coupling the second current source to the second current path, the second current source selectively connectable to the second transistor via the current mirror transistor.

24. The amplifier circuit of claim 1, including a second current source for feeding the second current path, and a current mirror transistor four coupling the second current source to the second current path, the second current source selectively connectable to the second transistor via the current mirror transistor.

25. A low-noise amplifier circuit, comprising:
   a signal input for receiving a radio-frequency signal;
   a signal output for providing an amplified signal which is derived from the radio-frequency signal;
   a first current path coupled between the signal input and the signal output, said first current path including a first transistor connected in a common-base circuit;
   a second current path coupled between the signal input and the signal output, said second current path including a second transistor connected in a common-emitter circuit, the second transistor having a collector and a base, and including a feedback path coupled between the collector and the base of the second transistor;
   a third transistor connected in a common-base circuit;
   a resistor coupled between the collector of the second transistor and an emitter of the third transistor; and
   a switching circuit coupled to the first transistor, and configured to selectively connect a first bias voltage to the first transistor, and coupled to the third transistor and configured to selectively connect a second bias voltage to the third transistor, in accordance with a desired gain.

* * * * *